(12) United States Patent
Feng et al.

(10) Patent No.: US 7,733,246 B2
(45) Date of Patent: Jun. 8, 2010

(54) A/D CONVERTER FOR WIDEBAND DIGITAL COMMUNICATION

(75) Inventors: Xiang Guang Feng, San Jose, CA (US); Runsheng He, Sunnyvale, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 12/166,028

(22) Filed: Jul. 1, 2008

(65) Prior Publication Data

US 2008/0284627 A1 Nov. 20, 2008

Related U.S. Application Data

(63) Continuation of application No. 11/602,676, filed on Nov. 20, 2006, now Pat. No. 7,408,492, which is a continuation of application No. 11/001,927, filed on Dec. 1, 2004, now Pat. No. 7,158,061.

(60) Provisional application No. 60/592,291, filed on Jul. 28, 2004.

(51) Int. Cl.
*H03M 7/00* (2006.01)
*H03M 1/12* (2006.01)

(52) U.S. Cl. .......................... 341/50; 341/51; 341/138; 341/143; 341/155

(58) Field of Classification Search .................. 341/50, 341/51, 138, 155, 143, 137
See application file for complete search history.

(56) References Cited

U.S. PATENT DOCUMENTS

| | | | |
|---|---|---|---|
| 4,547,893 A * | 10/1985 | Gordon | 378/19 |
| 4,772,871 A | 9/1988 | Suzuki et al. | |
| 5,142,286 A * | 8/1992 | Ribner et al. | 341/143 |
| 5,198,816 A | 3/1993 | Kalinowski et al. | |
| 5,274,375 A * | 12/1993 | Thompson | 341/143 |
| 6,043,659 A | 3/2000 | McKinnon | |
| 6,252,531 B1 | 6/2001 | Gordon et al. | |
| 6,445,319 B1 | 9/2002 | Bugeja | |
| 6,498,577 B1 | 12/2002 | Lin | |
| 7,295,813 B2 | 11/2007 | Haub et al. | |

OTHER PUBLICATIONS

D. Weiler et al., "Single Bit Sigma-Delta Modulator with Nonlinear Quantization for μ-Law Coding," Fraunhofer Institute of Microelectronic Circuits and Systems Finkstrabe 61, D-47057 Duisburg, Germany.

* cited by examiner

*Primary Examiner*—Jean B Jeanglaude

(57) ABSTRACT

Circuitry for providing non-uniform analog-to-digital ("A/D") signal conversion for wideband signals is provided. The circuitry of the invention is optimized for wideband signals because it does not sacrifice the small-scale resolution of high-probability signal amplitudes while preventing the clipping of low-probability signal amplitudes. The circuitry includes a nonlinear amplifier and an A/D converter that may be uniform or non-uniform. The digital output of the A/D converter may be further processed by circuitry that has an output function that is the inverse of that of the nonlinear amplifier, so as to maintain linear A/D conversion.

28 Claims, 2 Drawing Sheets

A/D CONVERTER FOR WIDEBAND DIGITAL COMMUNICATION

This application is a continuation U.S. patent application Ser. No. 11/602,676, filed Nov. 20, 2006, which is a continuation of U.S. patent application Ser. No. 11/001,927, filed Dec. 1, 2004 (now U.S. Pat. No. 7,158,061), which claims the benefit of U.S. Provisional Application No. 60/592,291, filed Jul. 28, 2004, each of which is hereby incorporated by reference herein in its entirety.

BACKGROUND OF THE INVENTION

This invention relates to analog-to-digital ("A/D") signal conversion in wideband digital communication. Specifically, the invention relates to improving the dynamic range of A/D converters ("ADCs").

Currently, in many areas of high-speed digital communication, analog signals are processed and converted into digital data by being downconverted, filtered, and amplified to a particular analog baseband frequency prior to A/D conversion. As a result, such signals are confined to certain frequency boundaries and therefore make ADCs with uniform quantization (i.e., equal granularity or step sizes between increments) an acceptable solution for such applications.

However, the recent advent of digital cable television and cellular phone technologies such as CDMA (Carrier Division Multiple Access) has brought about an increase in the use of wideband digital signals. These signals, which may typically be approximated by a Gaussian probability distribution function, are generally small in amplitude with extremely large amplitude spikes. As a result, the dynamic range of the previous uniform ADCs are no longer adequate, since they would result in either the sacrificing of small-scale resolution or else would clip the large-amplitude signals due to their limited range.

It would therefore be desirable to design an ADC with non-uniform granularity for wideband signals that require a large dynamic range. It would further be desirable to design an ADC with non-uniform granularity, without sacrificing small-scale resolution or clipping the large amplitude signal components. Finally, it would be desirable to design an ADC with non-uniform granularity and without a costly increase in the amount of hardware required to implement the ADC.

SUMMARY OF THE INVENTION

According to the present invention, circuitry for performing non-uniform analog-to-digital signal conversion for accommodating wideband signals such as those previously described is provided. The circuitry may be implemented using a linear ADC. The ADC is preceded by a nonlinear amplifier that may demonstrate, for example, a relatively smaller gain for input signals with comparatively small amplitudes and a relatively larger gain for input signals having comparatively larger amplitudes. The combined effect of the nonlinear amplifier and the ADC is to provide analog-to-digital conversion that exhibits small quantization noise for small-amplitude (i.e., high probability) signals and larger quantization noise for large-amplitude (i.e., low probability) signals, for instance. The resultant digital signals from the ADC may be subsequently processed by inverse transfer function circuitry in order to preserve a linear relationship between the input and output signals.

The circuitry of the present invention demonstrates increased small-scale resolution without clipping the large-scale signal components or requiring substantial additional circuitry. The improvement in the signal-to-noise ("SNR") ratio of the non-uniform ADC compared to a uniform ADC for these wideband signal inputs is substantial. For example, for an input consisting of 10 QAM (Quadrature Amplitude Modulation) channels in which one channel has 10 dB less power than the other channels (typical of cable television and wireless communication), the SNR of a 7-bit ADC that is preceded by a nonlinear amplifier implementing a square-root function may be 10 dB better than that of a normal uniform 7-bit ADC.

DETAILED DESCRIPTION OF THE PREFERRED EMBODIMENTS

Figure 1:
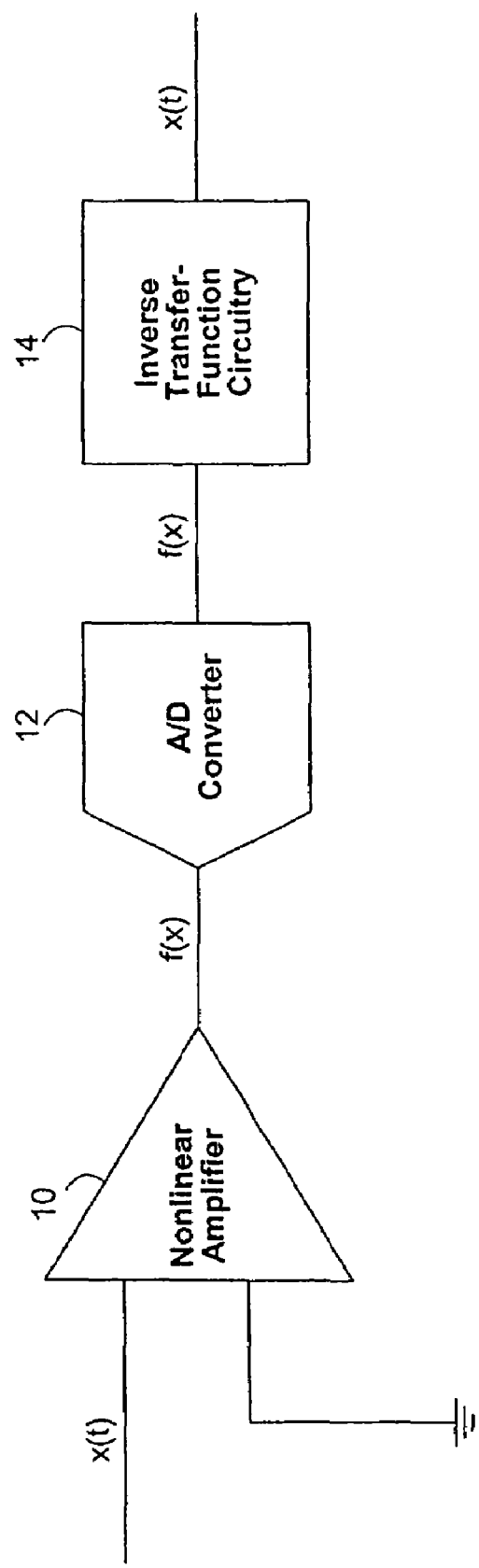
FIG. 1 is a simplified block diagram of an illustrative embodiment of A/D conversion circuitry in accordance with the present invention.

FIG. 1 shows an illustrative block diagram of the circuitry of the present invention. The circuitry in FIG. 1 includes a first nonlinear amplifier 10, ADC 12, and inverse transfer function circuitry 14. Analog input signals are first transmitted to nonlinear amplifier 10. Nonlinear amplifier 10 amplifies the input signals according to a nonlinear output function $f(x)$. The amplified signals are then passed on to ADC 12. ADC 12 digitizes the amplified incoming analog signals, and subsequently outputs the converted digital signals to inverse transfer function circuitry 14. Inverse transfer function circuitry 14 has an output function that is the inverse (i.e., $f^{-1}(x)$) of that of nonlinear amplifier 10. Circuitry 14 performs a nonlinear mapping to the received digital signals that results in the desired linear relationship between the analog input and the final digital output signals.

Figure 2:
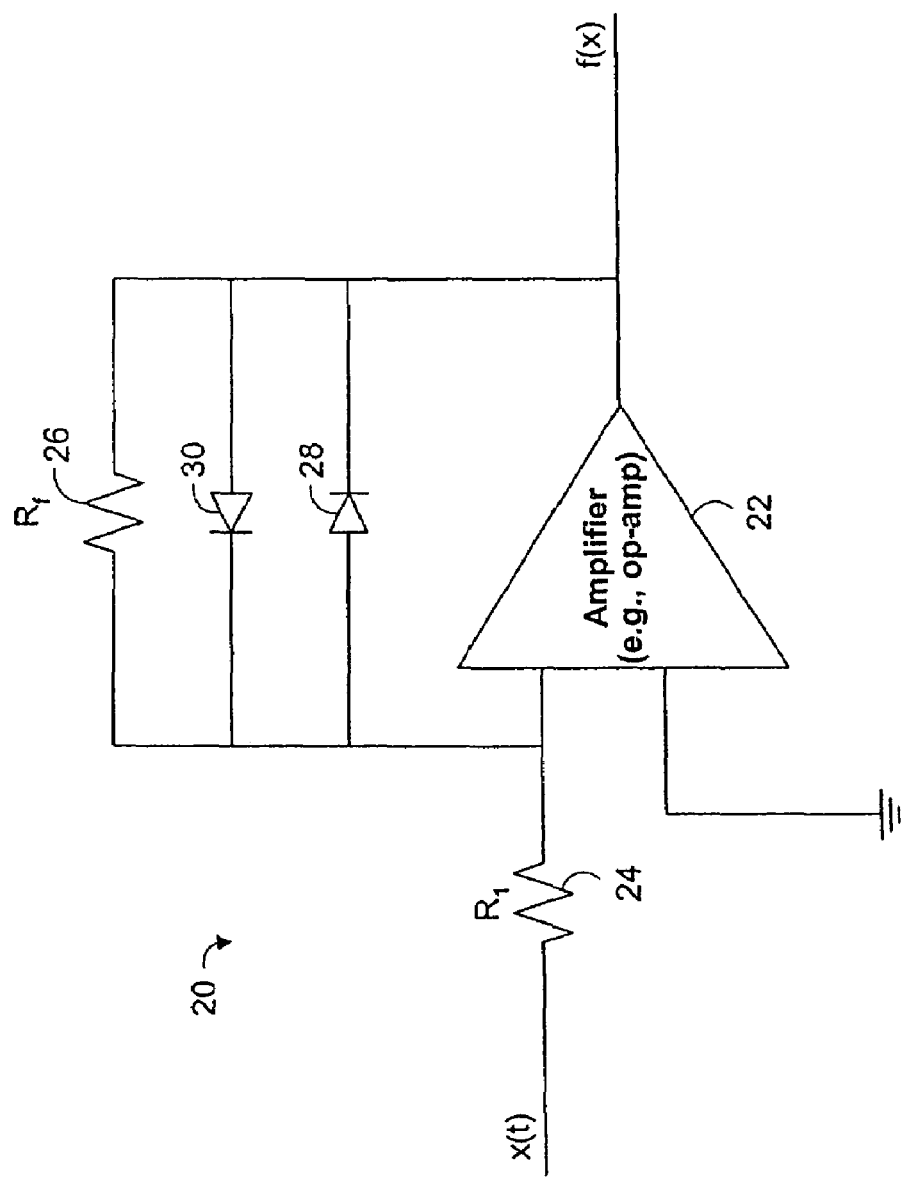
FIG. 2 is an illustrative circuit diagram of a nonlinear amplifier portion of the A/D conversion circuitry in accordance with the present invention.

FIG. 2 is an illustrative circuit diagram of nonlinear amplifier 10 in accordance with the present invention. In particular, nonlinear amplifier 20 in FIG. 2 includes amplifier 22, resistors 24 and 26, and matched diodes 28 and 30. Amplifier 22 may be for instance an operational amplifier ("op-amp"). Diodes 28 and 30 are connected in parallel facing opposite directions and are matched to each other so as to cause nonlinear amplifier 20 to produce an output that has zero-input symmetry. In other words, the output of nonlinear amplifier 20 is dependent only on the magnitude of the input.

The gain of nonlinear amplifier 20 is determined by the electrical characteristics of resistors 24 and 26 and of diodes 28 and 30. Specifically, the amount of current I across diodes 28 and 30 for a given voltage drop V across the diodes is (the same equation applies to both diodes):

$$I = I_o \times ((\exp(V/V_o) - 1)$$

where $I_o$ and $V_o$ are constant values that depend on the characteristic of each corresponding diode. Plugging this expression into the equation for the impedance Zd for each diode yields:

$$Z_d = V/I = V/(I_o \times ((\exp(V/V_o) - 1))$$

The diode impedance $Z_{d,28}$ for diode 28—the diode with the positive conductivity in the circuit arrangement shown in FIG. 2—may subsequently be used in determining the output function of nonlinear amplifier 20 (the contribution of diode 30 to the output function is negligible compared to that of diode 28 and therefore may be ignored). Specifically, the output function of nonlinear amplifier 20 expressed in terms of the $R_1$ (the resistance of resistor 24), $R_F$ (the resistance of feedback resistor 26) and $Z_{d,28}$ is given by the equation:

$$f(x)=x(t)\times(R_f\times Z_{d,28}/(R_f+Z_{d,28}))/R_1$$

It is thus seen from the above expressions that when the input voltage signal is small (i.e., for small amplitude signals), the impedance of diode 28 is much larger than Rf, and as a result the gain of nonlinear amplifier 20 is approximately Rf/R1. On the other hand, when the input signal is large, the impedance of diode 28 is much smaller than Rf, and as a result the gain of nonlinear amplifier 20 is logarithmically related to the input signal. Therefore, the overall effect of nonlinear amplifier 20 is to limit the amplifier gain for small-amplitude input signals and to compress the amplifier gain for large-amplitude input signals. As a result, when the amplified signals are transmitted to the ADC and quantized, the quantization step that is applied to the small-amplitude input signals is effectively smaller than the quantization step applied to the large-amplitude input signals, thereby allowing a uniform ADC to achieve non-uniform granularity at little additional cost in hardware. The non-uniform granularity created by the nonlinear amplifier helps to reduce the quantization noise created by a fixed-resolution ADC and substantially improves the SNR of the ADC.

After the analog input signals have been processed by the nonlinear amplifier 10, the nonlinear data is digitized by ADC 12 and subsequently sent to inverse transfer function circuitry 14. The purpose of inverse transfer function circuitry 14 is to remap the nonlinear digital data so that the final digital output of the ADC circuitry is a linear function of the analog input. Therefore, if the nonlinear amplifier 14 implemented the output function shown above with respect to FIG. 2, inverse transfer function circuitry 14 would implement an output function given by the following inverse expression:

$$f^{-1}(x)=x(t)\times((R_f+Z_d)/R_f\times Z_d)R_1$$

Although an exemplary circuit implementation exhibiting this particular output function is not shown, different circuit implementations for such a function will be readily apparent to one of ordinary skill in the art. For example, similar to nonlinear amplifier 10, inverse transfer function circuitry 14 may also utilize an op-amp along with matching diodes and linear resistors.

It will be understood from the foregoing that although the present invention has been described herein with respect to a particular type of nonlinear amplifier and ADC, other variations of nonlinear amplifiers and ADCs may be used without departing from the scope of the invention. For example, alternative nonlinear amplifiers that implement different output functions or use different circuit components may be employed. The specific output functions of the nonlinear amplifier—which thereby affects the granularity of the ADC—and of the corresponding inverse transfer function circuitry may be altered according to the probability density functions of the particular input signals of a given application. Furthermore, other types of ADCs besides uniform, linear ADCs may be used. For example, different types of nonlinear ADCs (e.g., ADCs with a stepwise output function) may be used in accordance with the present invention in order to further improve the dynamic range of the circuitry. Alternatively, a nonlinear ADC may be realized by not using inverse transfer function circuitry following a linear ADC. Depending on the particular application, the ADC may be implemented using a flash ADC, a sigma-delta ADC, or any other type of ADC that is known to one of ordinary skill in the art.

It will be understood, therefore, that the foregoing is only illustrative of the principles of the invention, and that various modifications can be made by those skilled in the art without departing from the scope and spirit of the invention, and that the present invention is limited only by the claims that follow.

What is claimed is:

1. A circuit for performing analog-to-digital conversion of an input signal, the circuit comprising:
   an amplifier that applies a first gain to small input signals and applies a second gain to large input signals, wherein the first gain is larger than the second gain; and
   an analog to digital converter that quantizes an output signal of the amplifier to form a quantized signal.

2. The circuit of claim 1, further comprising circuitry that operates on the quantized signal.

3. The circuit of claim 2, wherein:
   the amplifier implements a first transfer function to apply the first and second gains; and
   the circuitry performs a second transfer function on the quantized signal, wherein the second transfer function is approximately inverse to the first transfer function.

4. The circuit of claim 2, wherein the circuitry outputs a signal that is linearly related to the input signal.

5. The circuit of claim 1, wherein the amplifier further comprises a feedback path for receiving a feedback signal, wherein the feedback path comprises a feedback resistive element, a first diode and a second diode, wherein:
   the first and second diodes are matched, and
   the first and second diodes are electrically coupled in parallel and in reverse directions relative to each other.

6. The circuit of claim 5, wherein the resistive element controls the first gain.

7. The circuit of claim 6, wherein the first gain is a maximum gain of the amplifier.

8. The circuit of claim 5, wherein the first diode controls the second gain for a negative input signal and wherein the second diode controls the second gain for a positive input signal.

9. The circuit of claim 1, wherein the first gain is linear and the second gain is logarithmic.

10. The circuit of claim 1, wherein the amplifier outputs the output signal in accordance with:

$$f(x)=x(t)*(Rf*(Z/(Rf+Z)))/R1$$

where $f(x)$ is the output signal; $x(t)$ is the input signal; Rf is a first impedance; R1 is a second impedance; and Z is a third impedance.

11. The circuit of claim 1, wherein an amplitude of the output signal is substantially the same for positive and negative input signals.

12. The circuit of claim 1, wherein the analog to digital converter is a uniform analog to digital converter and wherein the quantized signal has non-uniform characteristics.

13. A method for performing analog-to-digital conversion of an input signal, the method comprising:
   an amplifier applying a first gain to small input signals and applying a second gain to large input signals, wherein the first gain is larger than the second gain; and
   quantizing an output signal of the amplifier to form a quantized signal.

14. The method of claim 13, further comprising operating on the quantized signal.

15. The method of claim 14, further comprising:
   performing a first transfer function to apply the first and second gains; and
   performing a second transfer function to operate on the quantized signal, wherein the second transfer function is approximately inverse to the first transfer function.

16. The method of claim 14, wherein operating on the quantized signal comprises providing a signal that is linearly related to the input signal.

17. The method of claim 13, wherein the output signal is produced in accordance with:

$$f(x)=x(t)*(Rf*(Z/(Rf+Z)))/R1$$

where $f(x)$ is the output signal; $x(t)$ is the input signal; Rf is a first impedance; R1 is a second impedance; and Z is a third impedance.

18. The method of claim 17, wherein a maximum gain of the output signal depends on a value of the first impedance.

19. The method of claim 13, wherein an amplitude of the output signal is substantially the same for positive and negative input signals.

20. The method of claim 13, wherein the first gain is linear and the second gain is logarithmic.

21. An apparatus for performing analog-to-digital conversion of an input signal, the apparatus comprising:
    amplifying means for applying a first gain to small input signals and applying a second gain to large input signals, wherein the first gain is larger than the second gain; and
    means for quantizing an output signal of the amplifier means to form a quantized signal.

22. The apparatus of claim 21, further comprising means for operating on the quantized signal.

23. The apparatus of claim 22, further comprising:
    means for performing a first transfer function to apply the first and second gains; and
    means for performing a second transfer function to operate on the quantized signal, wherein the second transfer function is approximately inverse to the first transfer function.

24. The apparatus of claim 22, wherein the means for operating on the quantized signal comprises means for providing a signal that is linearly related to the input signal.

25. The apparatus of claim 21, wherein the output signal is produced in accordance with:

$$f(x)=x(t)*(Rf*(Z/(Rf+Z)))/R1$$

where $f(x)$ is the output signal; $x(t)$ is the input signal; Rf is a first impedance; R1 is a second impedance; and Z is a third impedance.

26. The apparatus of claim 25, wherein a maximum gain of the output signal depends on a value of the first impedance.

27. The apparatus of claim 21, wherein an amplitude of the output signal is substantially the same for positive and negative input signals.

28. The apparatus of claim 21, wherein the first gain is linear and the second gain is logarithmic.

* * * * *